(12) United States Patent
Kurihara et al.

(10) Patent No.: US 6,522,543 B2
(45) Date of Patent: Feb. 18, 2003

(54) IC HEAT RADIATION STRUCTURE AND DISPLAY DEVICE

(75) Inventors: Mikio Kurihara, Yamato (JP); Yoshihisa Yamada, Sagamihara (JP); Fumihisa Hanzawa, Machida (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,640

(22) Filed: Oct. 1, 2001

(65) Prior Publication Data

US 2002/0048152 A1 Apr. 25, 2002

(30) Foreign Application Priority Data

Sep. 29, 2000 (JP) ........................................ 2000-300720

(51) Int. Cl.[7] ................................................. H05K 7/20
(52) U.S. Cl. ..................... 361/704; 361/705; 361/707; 361/719; 361/749; 174/252; 174/254; 174/255; 174/260; 165/80.2; 165/185; 345/60; 349/58; 349/150
(58) Field of Search ................................. 361/687, 681, 361/704, 707, 714, 719, 808, 809, 825, 831; 174/254, 260; 165/80.2, 80.3; 349/150, 58; 345/60

(56) References Cited

U.S. PATENT DOCUMENTS

| 5,719,752 | A | * | 2/1998 | Mori et al. .................. 361/807 |
| 5,805,417 | A | * | 9/1998 | Nakagawa et al. ......... 361/687 |
| 5,808,707 | A | * | 9/1998 | Niibori et al. ................ 349/60 |
| 5,838,412 | A | * | 11/1998 | Ueda et al. .................. 349/150 |
| 5,949,512 | A | * | 9/1999 | Taguchi ....................... 349/150 |
| 6,166,788 | A | * | 12/2000 | Ha et al. ....................... 349/58 |
| 6,366,264 | B1 | * | 4/2002 | Kurumada .................... 345/60 |

FOREIGN PATENT DOCUMENTS

JP 11-112174 4/1999 ............ H05K/7/20

* cited by examiner

*Primary Examiner*—Boris Chervinsky
(74) *Attorney, Agent, or Firm*—Derek S. Jennings (57) ABSTRACT

A first heat-conductive rubber is disposed on a surface of a printed wiring film, which is an opposite side to a driver IC, a second heat-conductive rubber is disposed on a surface of the driver IC, which is an opposite side to the surface of the printed wiring film, and the first heat-conductive rubber is made harder than the second heat-conductive rubber. In addition, heat-conductive grease is coated on a surface of the first heat-conductive rubber, which contacts the printed wiring film, and on a surface of the second heat-conductive rubber, which contacts the driver IC.

9 Claims, 5 Drawing Sheets

IC HEAT RADIATION STRUCTURE AND DISPLAY DEVICE

BACKGROUND OF INVENTION

The present invention relates to an IC heat radiation structure capable of effectively radiating heat emitted from the IC, and to a display device equipped with the IC heat radiation structure.

Figure 4:
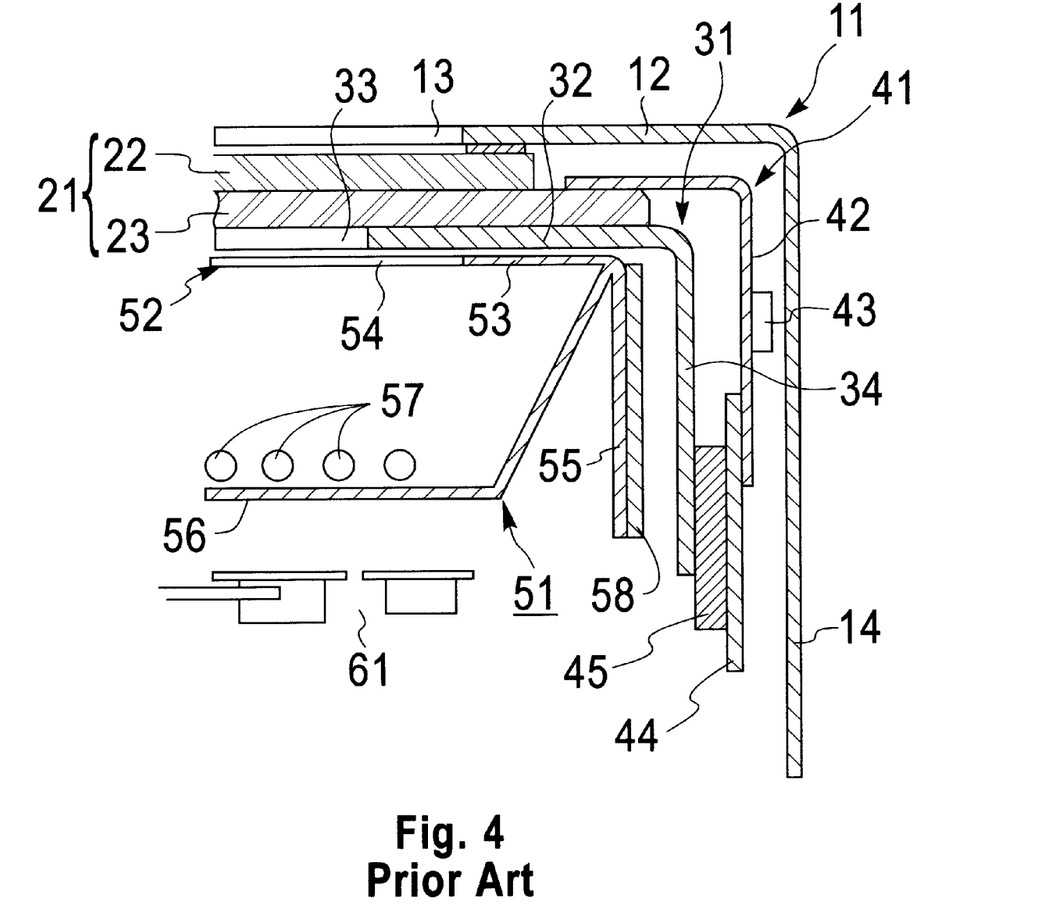
FIG. 4 is a partially sectional view of a constitution of a conventional liquid crystal display device with a direct backlight.

FIG. 4 is a partially sectional view shows the construction of a conventional liquid crystal display device with a direct backlight.

In FIG. 4, a reference numeral 11 denotes a bezel made of metal. In the bezel 11, on a periphery of a front plate 12 molded into a picture frame shape with an aperture 13, a sidewall 14 extended downward and perpendicularly to the front plate 12.

A reference numeral 21 denotes a liquid crystal display panel. In the liquid crystal display panel 21, a transparent electrode is formed on inner surfaces of two glass substrates 22 and 23 sandwiching liquid crystal. The liquid crystal display panel 21 is attached to a back surface of the front plate 12 so that the aperture 13 of the bezel 11 and a display portion of the liquid crystal display panel 21 are aligned.

A reference numeral 31 denotes a frame made of metal. In the frame 31, on a periphery of a front plate 32 molded into a picture frame shape with an aperture 33, a sidewall 34 extended downward and perpendicularly to the front plate 32. The liquid crystal display panel 21 is attached to a front surface of the front plate 32 so that the aperture 33 and the display portion of the liquid crystal display panel 21 are aligned.

A reference numeral 41 denotes a tape carrier package (TCP). The TCP 41 has a printed wiring film 42 fitted with a driver IC 43 for allowing the liquid crystal display panel 21 to display images. In the TCP 41, an electrode on one end of the printed wiring film 42 is connected to an electrode continuous with the transparent electrode of the glass substrate 23 with an anisotropic conductive film (ACF).

A reference numeral 44 denotes a control circuit substrate. In the control circuit substrate 44, an electrode thereof is connected and fixed to an electrode on the other end of the printed wiring film 42 with the ACF or solder.

A reference numeral 45 denotes a substrate stage for supporting the control circuit substrate 44. The substrate stage 45 is attached to the control circuit substrate 44.

A reference numeral 51 denotes a backlight unit. The backlight unit 51 comprises: a front frame 52 having a sidewall 55 on a periphery of a front plate 53 molded into a picture frame shape with an aperture 54, the sidewall being extended downward and perpendicularly to the front plate 53; a rear frame 56 detachably attached to a back surface of the front frame 52 and having a reflection film attached to a surface which serves as a reflection surface; lamps 57 attached to the rear frame 56; and a heat insulator 58 attached to an outer surface of the sidewall 55.

A reference numeral 61 denotes an interface for supplying electric powers to the respective portions by unillustrated wiring.

Next, an operation thereof will be described.

First, electric powers are supplied to the driver IC 43, the control circuit substrate 44 and the lamps 57 via the interface 61.

Then, the control circuit substrate 44 operates the driver IC 43 in accordance with a signal supplied thereto, and allows the liquid crystal display panel 21 to display specified images. Thus, the images displayed on the liquid crystal display panel 21 can be visibly recognized by light from the lamps 57.

Heat generated during the operation of the respective portions is radiated to peripheries thereof.

In recent years, accompanied with enlargement and higher definition of the liquid crystal display panel 21, power consumption of the driver IC 43 for allowing the liquid crystal display panel 21 to display images has been increased.

Therefore, an attempt has been made for effectively radiating heat emitted from the driver IC 43 by attaching a heat radiation member such as a heat sink and a heat-conductive rubber thereto. However, since the driver IC 43 is attached to the printed wiring film 42, direct attachment of the heat radiation member to the driver IC 43 causes a problem that disconnection tends to occur between the printed wiring film 42 and the driver IC 43.

SUMMARY OF INVENTION

The present invention was made in order to solve the foregoing inconvenience. An object of the present invention is to provide an IC heat radiation structure capable of effectively radiating heat emitted from an IC and a display device provided with the IC heat radiation structure.

A feature of the present invention includes an IC heat radiation structure for radiating heat emitted from an IC. The IC heat radiation structure holds a TCP fitted with the IC attached to a printed wiring film. Further included is a holding member for holding the TCP, a heat-conductive interposition member disposed between the holding member and the TCP, and a heat-conductive slip member disposed between the interposition member and the TCP or between the interposition member and the holding member.

Another feature of the present invention includes an IC heat radiation structure for radiating heat emitted from an IC. The foregoing IC heat radiation structure holds a TCP with the IC attached to a printed wiring film. Further included is a holding member for holding the TCP, a heat-conductive and elastic interposition member disposed between the holding member and the TCP, and a sheet harder than the interposition member disposed so as to contact the TCP. The sheet is disposed between the foregoing interposition member and the TCP.

Yet, another feature of the present invention is an IC heat radiation structure for radiating heat emitted from an IC. The foregoing IC heat radiation structure holds a TCP with the IC attached to a printed wiring film. Further included is a holding member for holding the TCP, and a heat-conductive interposition member disposed between the holding member and both surfaces of the TCP. The TCP has a surface where a protrusion of the IC is larger (the second heat-conductive rubber 84 side in FIG. 1, that is, the IC side) and a surface opposite thereto. The interposition member between the holding member and the opposite surface is made harder than the interposition member between the holding member and the surface at the IC side.

Still another feature of the present invention includes an IC heat radiation structure, wherein one surface of a TCP with an IC attached to a printed wiring film is movably held, and heat emitted from the foregoing IC is radiated therefrom. In this case, the foregoing IC is desirably held movably. In addition, a surface for holding is desirably formed of a heat-conductive slip member capable of moving the TCP to an in-surface direction of the printed wiring film.

Still yet another feature of the present invention includes a display device provided with a TCP with a driver IC attached to a printed wiring film. The driver IC allows a display panel to display images. Further included is an IC heat radiation structure for radiating heat emitted from the driver IC. The IC heat radiation structure includes a holding member for holding the TCP, a heat-conductive interposition member disposed between the holding member and the TCP, and a heat-conductive slip member disposed between the interposition member and the TCP or between the interposition member and the holding member.

Still yet a further feature of the present invention is a display device provided with a TCP with a driver IC attached to a printed wiring film. The foregoing driver IC allows a display panel to display images. Further included is an IC heat radiation structure for radiating heat emitted from the driver IC. The IC heat radiation structure includes a holding member for holding the TCP, a heat-conductive and elastic interposition member disposed between the holding member and the TCP, and a sheet harder than the interposition member disposed so as to contact the TCP. The sheet is disposed between the interposition member and the TCP.

Another feature of the present invention is a display device provided with a TCP with a driver IC attached to a printed wiring film. The foregoing driver IC allows a display panel to display images. Included is an IC heat radiation structure for radiating heat emitted from the driver IC. The foregoing IC heat radiation structure includes a holding member for holding the TCP, and a heat-conductive interposition member disposed between the holding member and both surfaces of the TCP. The TCP has a surface where a protrusion of the foregoing driver IC is larger and a surface opposite thereto. The interposition member between the holding member and the opposite surface is harder than the interposition member between the holding member and the surface where the IC protrusion is larger.

The present invention is a display device provided with a TCP with a driver IC attached to a printed wiring film. The foregoing driver IC allows a display panel to display images. Further included is an IC heat radiation structure for radiating heat emitted from an IC. The IC heat radiation structure is movably holding one surface of the TCP.

Various other objects, features, and attendant advantages of the present invention will become more fully appreciated as the same becomes better understood when considered in conjunction with the accompanying drawings, in which like reference characters designate the same or similar parts throughout the several views.

BRIEF DESCRIPTION OF DRAWINGS

For a more complete understanding of the present invention and the advantages thereof, reference is now made to the following description taken in conjunction with the accompanying drawings.

DETAILED DESCRIPTION

Hereinbelow, description will be made for embodiments of the present invention with reference to the accompanying drawings.

It will be noted that the holding members and interposition members are desirably disposed on both surfaces of the printed wiring film. A heat-conductive slip member disposed between the interposition member and the TCP or between the interposition member and the holding member is desirably provided on any one of the surfaces of the printed wiring film. The slip member is desirably disposed between the IC and the interposition member. The interposition member is desirably an elastic member. In addition, the slip member is desirably grease or a resin sheet.

Figure 1:
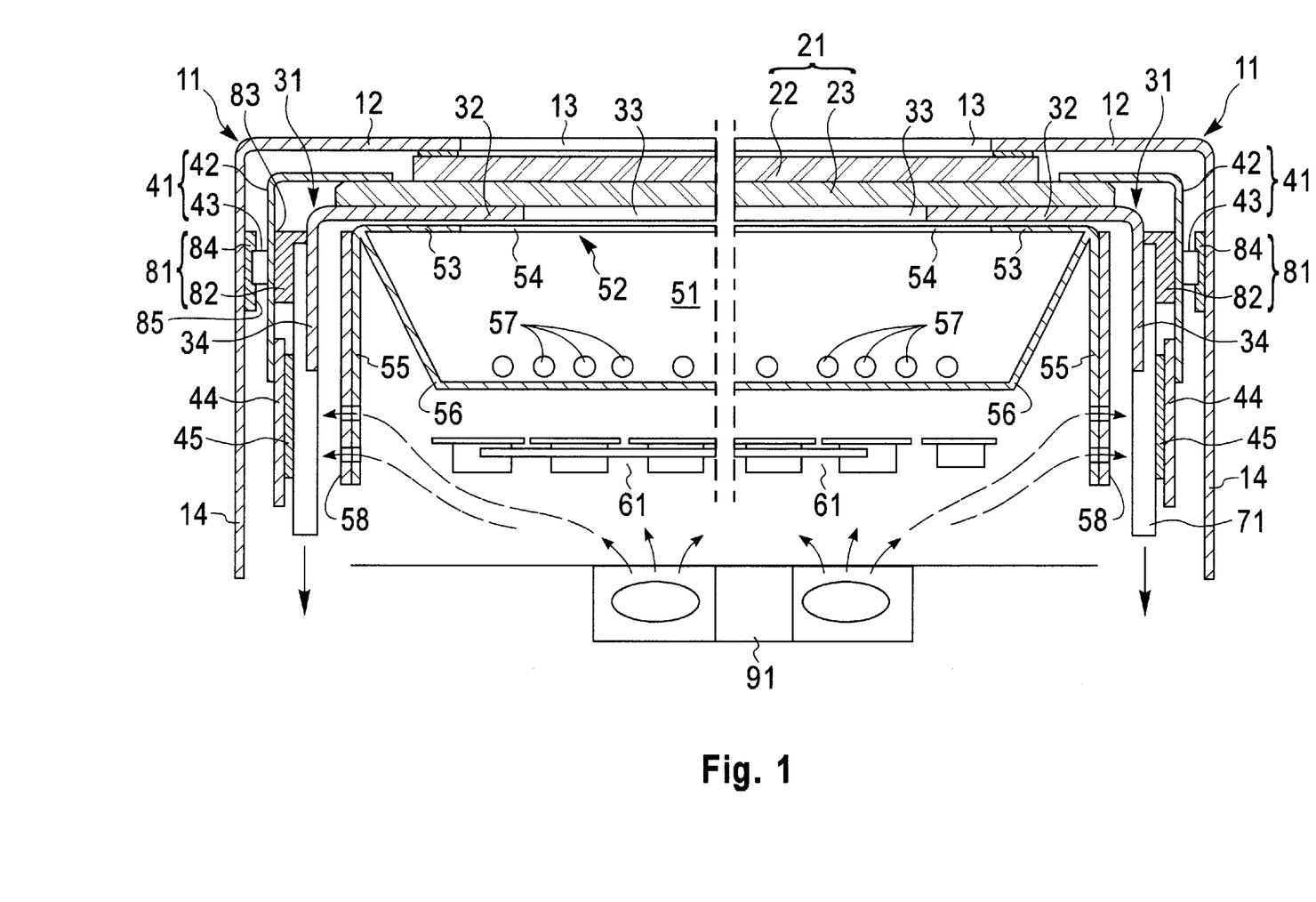
FIG. 1 is a partially omitted sectional view of a liquid crystal display device with a direct backlight according to a first embodiment of the present invention.
Figure 1A:
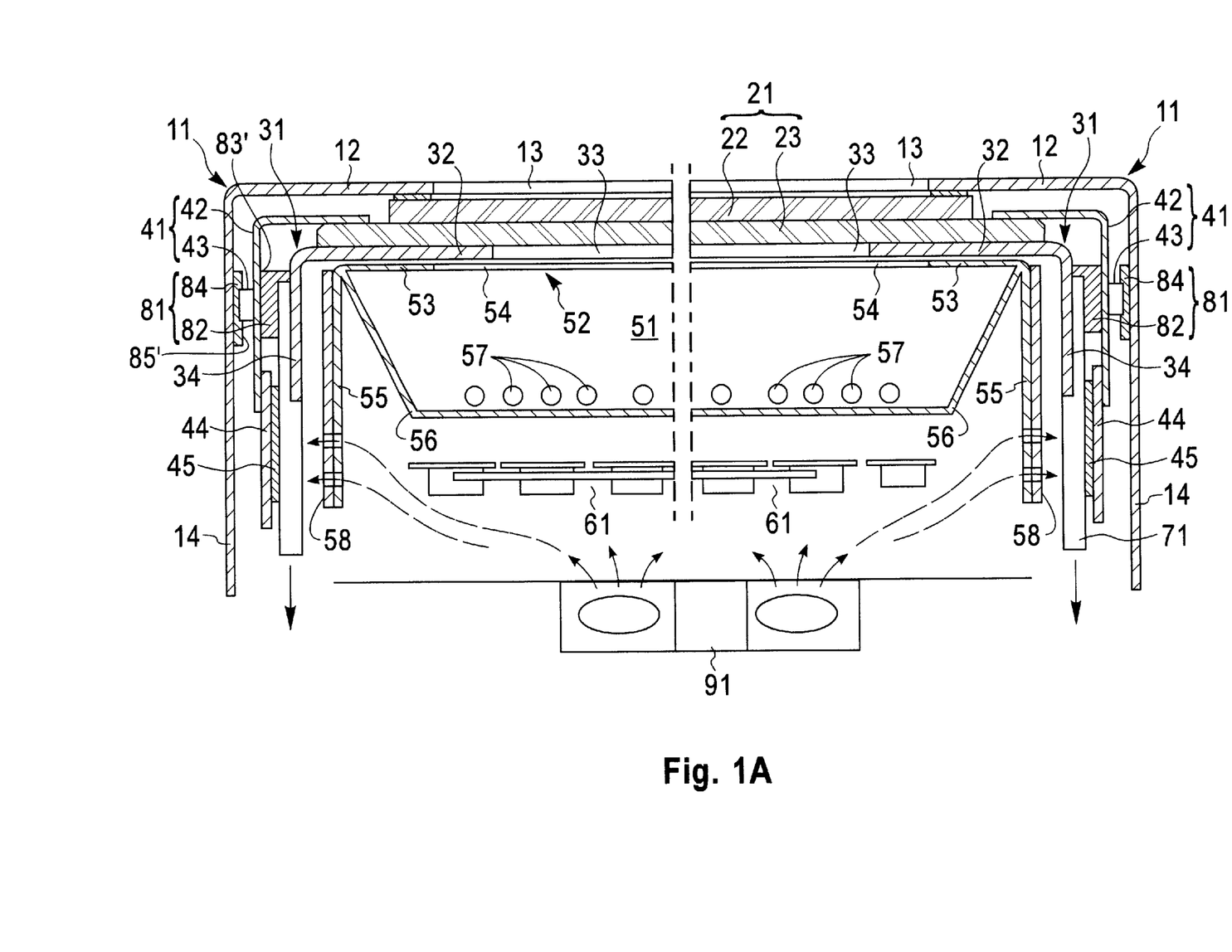

It is further noted that the sheet is desirably disposed on a surface of the TCP where an IC protrusion is smaller (the first heat-conductive rubber 82 side of the TCP 41 in FIG. 1, that is, the printed wiring film side). The IC is desirably pressed to a side of the sheet by a press member. The press member is desirably a heat-conductive and elastic one disposed between the holding member and the IC. And, holding members are disposed on both sides of the printed wiring film and a heat-conductive slip member is desirably disposed between the holding member and the foregoing IC at a side where the press member is disposed.

FIG. 1 is a partially omitted sectional view of a liquid crystal display device with a direct backlight according to a first embodiment of the present invention. In FIG. 1, the same portions as those in FIG. 4 or portions equivalent thereto are numbered with the same reference numerals, and the description thereof will be omitted.

In FIG. 1, a reference numeral 71 denotes a heat sink attached to the outer surface of the side plate 34 of the frame 31.

A reference numeral 81 denotes an IC heat radiation structure. The IC heat radiation structure 81 comprises: a first heat-conductive rubber 82 as an interposition member disposed between the side plate 34 of the frame 31 as well as the heat sink 71 and the printed wiring film 42; grease (83) as a heat-conductive slip member coated on a surface of the first heat-conductive rubber 82, which contacts the printed wiring film 42; a second heat-conductive rubber 84 softer than the first heat-conductive rubber 82 and disposed between the sidewall 14 of the bezel 11 and the driver IC 43, the second heat-conductive rubber 84 serving as an interposition member sandwiching and fixing the printed wiring film 42 and the driver IC 43 with the first heat-conductive rubber 82; and grease (85) as a heat-conductive slip member coated on a surface of the second heat-conductive rubber 84, which contacts the driver IC 43. A reference numeral 91 denotes a cooling fan.

In the first embodiment, holding members comprise: the bezel 11 (the sidewall 14); the frame 31 (the sidewall 34); and the heat sink 71.

However, the holding member at the side of the printed wiring film 42 may be the frame 31 (the sidewall 34) or the heat sink 71.

Moreover, a press member may be the second heat-conductive rubber 84, an elastic member which functions similarly to the grease (85), the bezel 11, or a combination functioning similarly to these.

Next, the heat radiation will be described.

Note that description for the operation will be omitted since it is similar to the background art.

First, while the heat emitted from the driver IC 43 is radiated to the periphery thereof, it is conducted via the grease (83) and the first heat-conductive rubber 82 to the frame 31 and then radiated therefrom, conducted via the grease (83) and the first heat-conductive rubber 82 to the heat sink 71 and then radiated therefrom, and conducted via the grease (85) and the second heat-conductive rubber 84 to the bezel 11 and then radiated therefrom.

Moreover, while the heat emitted from a control circuit substrate 44 is radiated to the periphery thereof, it is conducted via a substrate stage 45 to the heat sink 71 and then radiated also therefrom.

Furthermore, the heat radiated from the frame 31 and the heat sink 71 are radiated by agitating or discharging air by a fan 91.

Next, description will be made for a case where a shock is given to the liquid crystal display device.

When a shock is given to the liquid crystal display device, since the grease (83) is interposed between the printed wiring film 42 and the first heat-conductive rubber 82, and since the grease (85) is interposed between the driver IC 43 and the second heat-conductive rubber 84, due to the operation of the grease (83 and 85), the printed wiring film 42 is moved with respect to the first heat-conductive rubber 82, and the driver IC 43 is moved with respect to the second heat-conductive rubber 84. Thus, a shock in a lateral direction, that is, a shock in an in-surface direction of the printed wiring film 42 is absorbed.

Meanwhile, a shock in a direction perpendicular to the printed wiring film 42 is absorbed by elasticity of the first and second heat-conductive rubbers 82 and 84.

Moreover, the first heat-conductive rubber 82 is made harder than the second heat-conductive rubber 84. Thus, the first heat-conductive rubber 82 functions as a backing plate of the printed wiring film 42. Therefore, even if a force in the direction perpendicular to the driver IC 43 is given thereto by pressing the upper surface of the driver IC 43, the printed wiring film 42 and the driver IC 43 can be prevented from being disconnected by a shearing stress.

As described above, according to the first embodiment of the present invention, since the first and second heat-conductive rubbers 82 and 84 for sandwiching and fixing the printed wiring film 42 and the driver IC 43 are provided, the heat emitted from the driver IC 43 is effectively radiated via the first and second heat-conductive rubbers 82 and 84.

Hence, the driver IC 43 can be cooled.

Moreover, since the grease (83 and 85) is respectively interposed between the printed wiring film 42 and the first heat-conductive rubber 82 and between the driver IC 43 and the second heat-conductive rubber 84, due to the operation of the grease (83 and 85), the printed wiring film 42 is moved with respect to the first heat-conductive rubber 82, and the driver IC 43 is moved with respect to the second heat-conductive rubber 84, and thus absorbing a shock. Therefore, occurrence of disconnection in the printed wiring of the printed wiring film 42 is eliminated, and also, occurrence of the disconnection between the printed wiring and the driver IC 43 is eliminated.

Furthermore, the first and second heat-conductive rubbers 82 and 84 absorb the shock in the perpendicular direction. Thus, the disconnection between the printed wiring and the driver IC 43 can be prevented.

Furthermore, since the first heat-conductive rubber 82 is made harder than the second heat-conductive rubber 84, the first heat-conductive rubber 82 functions as a backing plate of the printed wiring film 42. Therefore, even if a force in the direction perpendicular to the driver IC 43 is given thereto by pressing the upper surface of the driver IC 43, the printed wiring film 42 and the driver IC 43 can be prevented from being disconnected by a shearing stress.

Hence, occurrence of disconnection in the printed wiring of the printed wiring film 42 is eliminated, and occurrence of disconnection between the printed wiring and the driver IC 43 is eliminated.

Moreover, since the heat of the driver IC 43 and the control circuit substrate 44 is radiated via the heat sink 71, the driver IC 43 and the control circuit substrate 44 can be cooled more efficiently.

Furthermore, since the heat generating portions including the driver IC 43 are forcibly cooled by the fan 91, the heat generating portions can be cooled far more efficiently.

Figure 2:
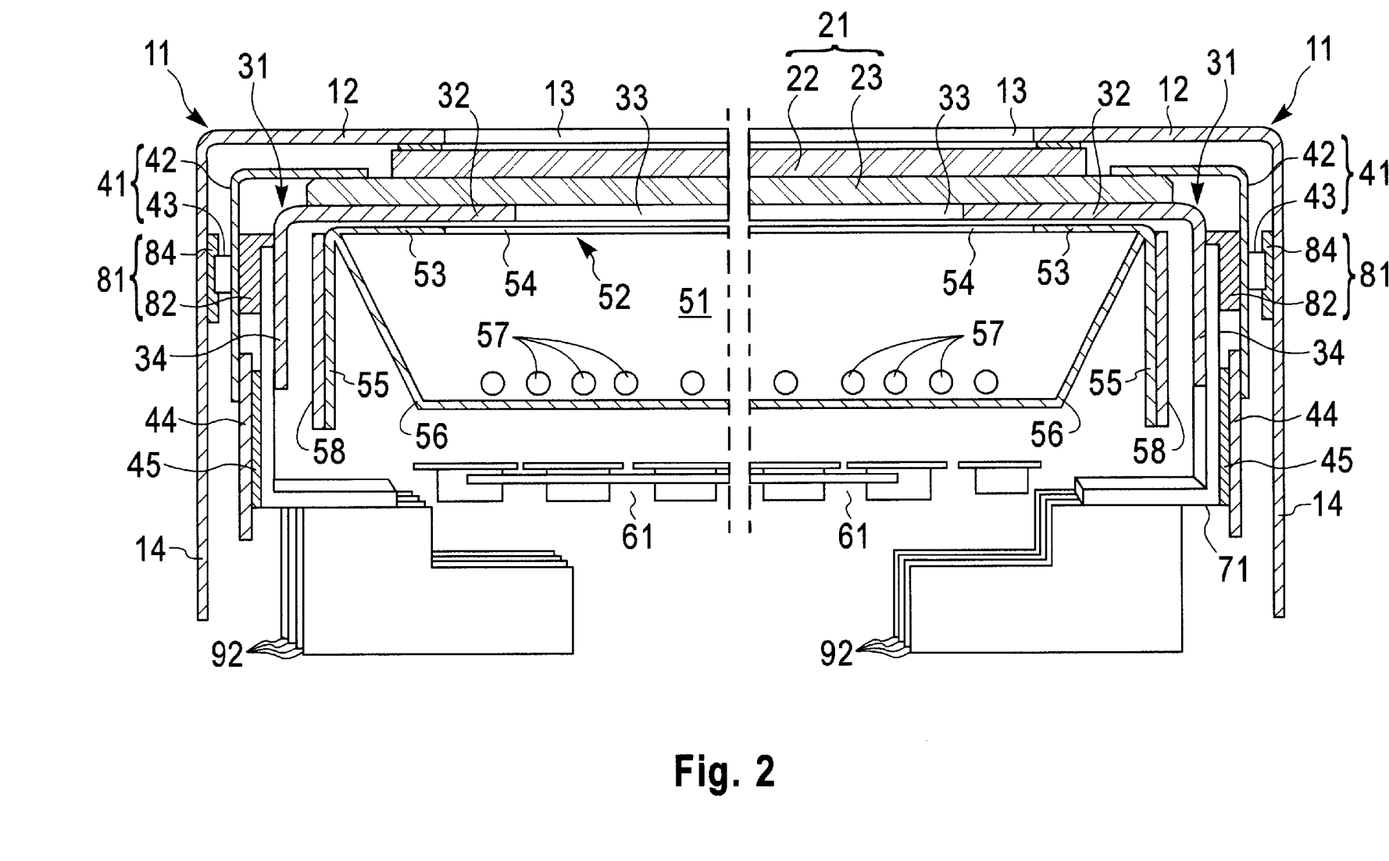
FIG. 2 is a partially omitted sectional view of a liquid crystal display device with a direct backlight according to a second embodiment of the present invention.

FIG. 2 is a partially omitted sectional view of a liquid crystal display device with a direct backlight according to a second embodiment of the present invention. In FIG. 2, the same portions as those in FIGS. 1 and 4 or portions equivalent thereto are numbered with the same reference numerals, and the description thereof will be omitted.

In FIG. 2, a reference numeral 92 denotes fins for heat radiation, which is attached to the heat sink 71.

Moreover, grease (83) is coated on the first heat-conductive rubber 82, and grease (85) is coated on the second heat-conductive rubber 84.

Since description for the operation, the heat radiation and the case where a shock is given in the second embodiment will be similar to those in the foregoing description, it will be omitted. Also in the second embodiment, the same effect as that in the first embodiment can be obtained.

Figure 3:
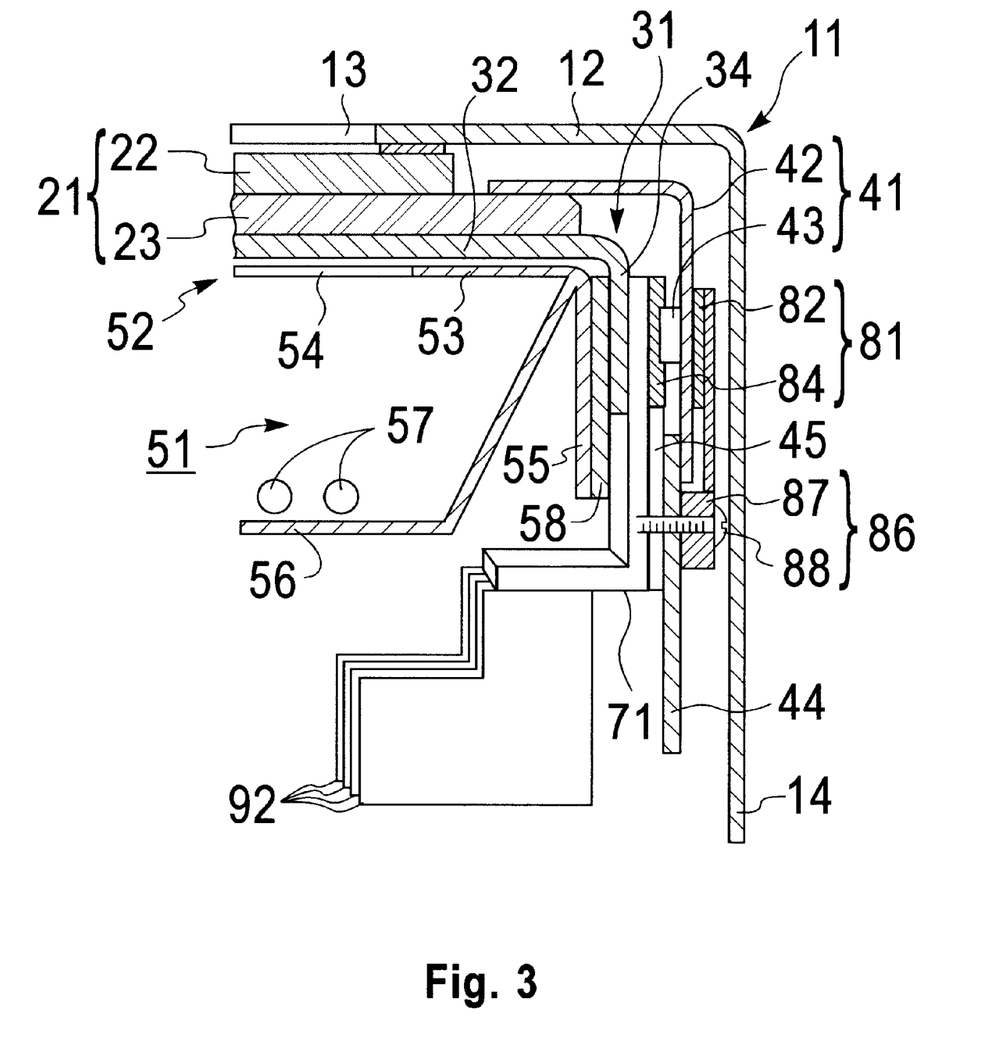
FIG. 3 is a partially sectional view of a liquid crystal display device with a direct backlight according to a third embodiment of the present invention.

FIG. 3 is a partially sectional view of a liquid crystal display device with a direct backlight according to a third embodiment of the present invention. In FIG. 3, the same portions as those in FIGS. 1, 2 and 4 or portions equivalent thereto are numbered with the same reference numerals, and the description thereof will be omitted.

In FIG. 3, a reference numeral 86 denotes an attachment member. The attachment member 86 is provided for fixing the first and second heat-conductive rubbers 82 and 84 to the sidewall 34 of the frame 31 via the control circuit substrate 44 and the like, the first and second heat-conductive rubbers 82 and 84 being provided for sandwiching and fixing the printed wiring film 42 and the driver IC 43. The attachment member 86 comprises: an attachment plate 87 for applying a pressure to the first and second heat-conductive rubbers 82 and 84 so that the rubbers 82 and 84 can sandwich and fix the printed wiring film 42 and the driver IC 43; and an attachment screw 88 for attaching the attachment plate 87 to the heat sink 71.

Moreover, grease (83) is coated on the first heat-conductive rubber 82, and grease (85) is coated on the second heat-conductive rubber 84.

In the third embodiment, holding members comprise the attachment member 86 and the heat sink 71.

However, the holding member at the side of the printed wiring film 42 may be the frame 31 (the sidewall 34).

Moreover, a press member may be the second heat-conductive rubber 84, an elastic member functioning similarly to the grease (85), the attachment member 86, or a combination which functions similarly to these.

Description for the operation, the heat radiation and the case where a shock is given in the third embodiment will be almost similar to those in the foregoing description. However, since there are some parts different from the above-description, such differences will be just described.

In the third embodiment, in the case where the liquid crystal display panel 21 and the frame 31 are detached from the bezel 11 or attached thereto. Thus, the liquid crystal display panel 21 can be attached to and detached from the bezel 11 with good operability, since the IC heat radiation structure 81 is attached to the frame 31 by the attachment member 86 and the heat sink 71.

Also in the third embodiment, the same effect as that in the first embodiment can be obtained.

In each of the above-described embodiments, description has been made for the liquid crystal display device with a direct backlight taken as an example.

However, as a matter of course, the embodiments can be also applied to a liquid crystal display device with a sidelight.

Moreover, the TCP 41 is not limited to a bent form, but may be one disposed parallel to the liquid crystal display panel 21.

Furthermore, description has been made for the liquid crystal display device provided with the liquid crystal display panel 21 taken as an example. However, as a matter of course, the embodiments can be also applied to a self light-emitting type display device using an active matrix-polymer light emitting diode (AM-PLED) or an active matrix-organic light emitting diode (AM-OLED), in which a voltage applied to an organic high molecular film is operated by an active element to control light emission of the organic high molecular film.

Furthermore, description has been made for the case where grease is used as a slip member. However, the slip member 83 and 85 may be a resin sheet, an elastic sheet with silicon resin added with alumina or silicon grease as far as each of the above can function similarly to the grease. In addition, the heat conductivity of the slip member may be equal to or less than those of the interposition members (first and second heat-conductive rubbers 82 and 84).

Still further, two heat-conductive rubbers are provided in the above embodiments, namely, the first heat-conductive rubber 82 contacting the printed wiring film 42 and the second heat-conductive rubber 84 contacting the driver IC 43. However, since only one of the heat-conductive rubbers functions similarly, the heat-conductive rubbers are not necessarily provided both.

Moreover, a case is also effective where two of the heat-conductive rubbers, namely, the first heat-conductive rubber 82 and the second heat-conductive rubber 84, are disposed and the slip member is provided on only one of the heat-conductive rubbers. Accordingly, the slip members are not necessarily provided on both of the heat-conductive rubbers.

In addition, instead of using the first heat-conductive rubber 82 harder than the second heat-conductive rubber 84, it is also possible to insert a hard member 82', which is harder than the first heat-conductive rubber 82, has heat conductivity, and functions as a backing plate or the like, between the printed wiring film 42 and the first heat-conductive rubber 82 as hard as the second heat-conductive rubber 84.

The insertion member 82' to be inserted therebetween can be a hard heat-conductive rubber, a hard resin sheet, a metal sheet or the like can be used. The heat conductivity of the insertion member may be equal to or less than that of the interposition member.

Furthermore, a constitution can be also adopted, in which the slip member is sandwiched between the heat-conductive rubbers, wherein one of the heat-conductive rubbers is set as an interposition member and the other is set as a holding member.

In addition, description has been made for the driver IC 43 taken as an example of an IC. However, the IC heat radiation structure in the embodiments can be applied to other ICs. Therefore, the use of the IC heat radiation structure is not limited to the display device, but the IC heat radiation structure can be used for other equipment such as a computer.

Note that, a side where the driver IC 43 slightly or hardly protrudes from the printed wiring film 42, that is, the side of the printed wiring film 42, is referred to as a side where an IC protrusion is smaller. In addition, a side where the driver IC 43 protrudes from the printed wiring film 42 by most or all of thickness thereof, that is, the side of the driver IC 43, is referred to as a side where an IC protrusion is large.

As described above, according to the present invention, the heat emitted from the IC can be radiated and the IC can be cooled without occurrence of disconnection between the printed wiring of the printed wiring film and the IC.

Although the preferred embodiments of the present invention have been described in detail, it should be understood that various changes, substitutions and alternations can be made therein without departing from spirit and scope of the inventions as defined by the appended claims.

What is claimed is:

1. An IC heat radiation structure for radiating heat emitted from a driver IC for displaying images on LCD display panel, said IC heat radiation structure holding a TCP with said IC attached to a printed wiring film of which one end is attached with an edge of a glass substrate of said LCD display panel, comprising:
    a holding member for holding said TCP;
    a heat-conductive and elastic interposition member disposed between said holding member and said TCP;
    a heat-conductive slip member disposed between said interposition member and said TCP;
    wherein heat emitted from said IC can be radiated through said interposition member and said heat-conductive slip member, and in response to a shock force applied to LCD, the TCP is horizontally and vertically moved within the elastic limit of said printed wiring film by elasticity of said interposition member and the slipping of said slip member to absorb said shock force.

2. The IC heat radiation structure according to claim 1, wherein said holding member and said interposition member are disposed on both surfaces of said printed wiring film, and,
    a heat-conductive slip member disposed between said interposition member and said holding member is provided on the surface of said printed wiring film.

3. The IC heat radiation structure according to claim 2, wherein said slip member is disposed between said IC and said interposition member.

4. The IC heat radiation structure according to claim 3, wherein said slip member is grease.

5. An IC heat radiation structure for radiating heat emitted from a driver IC for displaying images on LCD display panel, said IC heat radiation structure holding a TCP with said IC attached to a printed wiring film of which one end is attached with an edge of a glass substrate of said LCD display panel, comprising:
    a holding member for holding said TCP;
    a heat-conductive and elastic interposition member disposed between said holding member and said TCP; and a heat conductive sheet disposed so as to contact said TCP, said sheet being disposed between said interposition member and said TCP wherein heat emitted from said IC can be radiated through said interposition member and said heat-conductive sheet, and in response to a shock force applied to LCD, the TCP is horizontally and vertically moved within the elastic limit of said printed wiring film by elasticity of said interposition member and slipping of said sheet to absorb said shock force.

6. An IC heat radiation structure for radiating heat emitted from a driver IC for displaying images on LCD display panel, said IC heat radiation structure holding a TCP with said IC attached to a printed wiring film of which one end is attached with an edge of a glass substrate of said LCD display panel, comprising:

a holding member for holding said TCP; and a heat-conductive and elastic interposition member disposed between said holding member and both surfaces of said TCP, wherein said TCP has a surface where a protrusion of said IC is larger and a surface opposite thereto, said interposition member between said holding member and said opposite surface is harder than said interposition member between said holding member and said surface where said IC protrusion is larger, heat emitted from said IC can be radiated through said interposition member, and in response to a shock force applied to LCD, the TCP is horizontally and vertically moved within the elastic limit of said printed wiring film by elasticity of said interposition member to absorb said shock force.

7. A LCD display device provided with a TCP with a driver IC attached to a printed wiring film of which one end is attached with an edge of a glass substrate of said LCD display panel device, said driver IC allowing said LCD display device to display images, comprising:

an IC heat radiation structure for radiating heat emitted from said driver IC, wherein said IC heat radiation structure includes:

a holding member for holding said TCP;

a heat-conductive and elastic interposition member disposed between said holding member and said TCP; and a heat-conductive slip member disposed between said interposition member and said TCP;

wherein heat emitted from said IC can be radiated through said interposition member and said heat-conductive slip member, and in response to a shock force applied to said LCD display device, the TCP is horizontally and vertically moved within the elastic limit of said printed wiring film by elasticity of said interposition member and slipping of said slip member to absorb said shock force.

8. A LCD display device provided with a TCP with a driver IC attached to a printed wiring film of which one end is attached with an edge of a glass substrate of said LCD display panel device, said driver IC allowing said LCD display device to display images, comprising:

an IC heat radiation structure for radiating heat emitted from said driver IC, wherein said IC heat radiation structure includes:

a holding member for holding said TCP;

a heat-conductive and elastic interposition member disposed between said holding member and said TCP; and a heat-conductive sheet harder than said interposition member disposed so as to contact said TCP, said sheet being disposed between said interposition member and said TCP wherein heat emitted from said IC can be radiated through said interposition member and said heat-conductive slip member, and in response to a shock force applied to said LCD display device, the TCP is horizontally and vertically moved within the elastic limit of said printed wiring film by elasticity of said interposition member and slipping of said sheet to absorb said shock force.

9. A display device provided with a TCP with a driver IC attached to a printed wiring film, said driver IC allowing a display panel to display images, comprising:

an IC heat radiation structure for radiating heat emitted from said driver IC, wherein said IC heat radiation structure includes:

a holding member for holding said TCP; and a heat-conductive interposition member disposed between said holding member and both surfaces of said TCP, said TCP has a surface where a protrusion of said IC is larger and a surface opposite thereto, and said interposition member between said holding member and said opposite surface is harder than said interposition member between said holding member and said surface where said driver IC protrusion is larger.

* * * * *